(12) United States Patent
Muenzel et al.

(10) Patent No.: US 6,465,854 B1
(45) Date of Patent: Oct. 15, 2002

(54) MICROMECHANICAL COMPONENT

(75) Inventors: Horst Muenzel, Reutlingen; Helmut Baumann; Eckhard Graf, both of Gomaringen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/600,038

(22) PCT Filed: Nov. 26, 1998

(86) PCT No.: PCT/DE98/03472

§ 371 (c)(1),
(2), (4) Date: Sep. 15, 2000

(87) PCT Pub. No.: WO99/35477

PCT Pub. Date: Jul. 15, 1999

(30) Foreign Application Priority Data

Jan. 9, 1998 (DE) ............................ 198 00 574

(51) Int. Cl.⁷ ............................................. H01L 29/82
(52) U.S. Cl. ..................... 257/417; 257/415; 257/418
(58) Field of Search ................. 257/415, 417, 257/418, 419

(56) References Cited

U.S. PATENT DOCUMENTS

| | | | | |
|---|---|---|---|---|
| 5,216,490 A | * | 6/1993 | Greiff et al. | 73/517 R |
| 5,637,905 A | * | 6/1997 | Carr et al. | 257/418 |
| 5,640,039 A | * | 6/1997 | Chau et al. | 257/417 |
| 5,774,252 A | * | 6/1998 | Lin et al. | 359/224 |

FOREIGN PATENT DOCUMENTS

| | | |
|---|---|---|
| EP | 0 742 581 | 11/1996 |
| JP | 61 230382 | 10/1986 |
| JP | 05 273231 | 10/1993 |

OTHER PUBLICATIONS

Ueda et al., *Development of Micromachined Silicon Accelerometer*, No. 38, Jun. 1, 1994, pp. 72–77.

* cited by examiner

Primary Examiner—Ngân V. Ngô
(74) Attorney, Agent, or Firm—Kenyon & Kenyon

(57) ABSTRACT

A device, having at least one micromechanical surface structure patterned on a silicon substrate and a cap wafer covering the at least one surface structure. The cap wafer is formed from a glass wafer.

9 Claims, 1 Drawing Sheet

MICROMECHANICAL COMPONENT

BACKGROUND INFORMATION

The present invention relates to a device, having at least one micromechanical surface structure patterned on a silicon substrate and one protective cap covering the at least one surface structure, as well as a method for manufacturing the device.

Previous micromechanical devices. These include a silicon substrate, on whose surface a polycrystalline silicon layer is epitaxially grown using known processes. Micromechanical structures, e.g. seismic masses of sensor elements, micromotor actuators, or other movable structures, are produced in this silicon layer. For example, the patterning is attained by defined etch attacks from the upper side of the polycrystalline silicon, flexibly suspended structures being attainable by area-specific undercutting.

In order to protect the micromechanical structures from outside influences during normal use of the devices, these are known to be provided with a covering protective cap. In this case, this protective cap is known to be manufactured, in accordance with the device to be covered, as a patterned silicon wafer with which the wafer having the surface structure is joined. In order to form this joint, the cap wafer is provided with a meltable glass by means of screen printing. The cap wafer is subsequently aligned to the base wafer, and they are joined under pressure and at a temperature of approximately 400° C.

In this case, it is disadvantageous that the devices can only be manufactured by means of a relatively expensive manufacturing process using screen-printed, meltable glass. A particular disadvantage is, that in the joining procedure subsequent to the screen printing of the meltable glass, a certain amount of the meltable glass is unavoidably pressed out of the joining location or locations between the cap wafer and base wafer. In order to prevent the micromechanical structures from being influenced by the emerging glass, a relatively large contact or bonding surface is needed between the cap wafer and the base wafer. For example, if a bonding area is printed over with an approximately 500 $\mu$m wide glass layer, this results in an actual requirement of approximately 700 $\mu$m in the subsequent joining procedure, due to the glass spreading out laterally. This additionally required surface is not available for arranging functional structures of the device, so that the size of the known constructed devices are correspondingly large.

An additional disadvantage of the known devices is that a great deal of effort is required to hermetically seal them, since connecting the cap wafer using meltable glass applied by screen printing technically only allows a partial vacuum.

A further disadvantage is, that after joining the cap wafer to the base wafer, it is only possible to test the newly encapsulated micromechanical surface structures by measuring. Optical testing is not possible.

SUMMARY OF THE INVENTION

The device according to the present invention offers the advantage of being able to be manufactured using simple and reliably controllable method steps. Because the cap is formed from a glass wafer, the covering glass wafer can be joined to the base wafer of the device using robust methods suitable for mass production. In particular, when the surface of the base wafer facing the glass wafer is formed with a defined residual roughness, especially <40 nm, the glass wafer can be directly applied to the base wafer without applying intermediate adhesion-promoting layers.

Surprisingly, it was found that residual roughnesses <40 nm can be reproduced using, for example, so-called CMP methods (chemical mechanical polishing) for polycrystalline silicon layers, in which the micromechanical surface structures are laid out. Because the upper side pointing towards the glass wafer can be planarized in such a high-quality manner, joining techniques can be used that supercede the step, having the above-mentioned disadvantages, of inserting an additional adhesive agent, especially meltable glass applied by screen printing.

It is especially preferable to join the glass wafer to the base wafer by anodic bonding. By this means, relatively small bonding surfaces can be attained, which require a correspondingly reduced amount of space on the device. Therefore, the bonding surfaces can be placed closer to the functional structures of the device, so that their total surface requirement is reduced.

A further preferred refinement of the present invention provides for the glass wafer being optically transparent. This enables the micromechanical surface structures encapsulated by the glass wafer to undergo an optical examination after the device has been manufactured. It is also of great advantage, that the movements of the micromechanical structures can be evaluated optically, in that the micromechanical structures have, for example, active and/or passive optical elements with which optical signals passing through the transparent glass wafer can be evaluated.

It is also preferable, that the present device according to the invention can especially enclose vacuums of up to 1 mbar. In this manner, the micromechanical structures can be used very advantageously as seismic masses of rate-of-rotation sensors, in which a high-quality vacuum is used to attain a sufficient vibrational quality.

A further preferred refinement of the present invention provides at least one electrode arranged on the side of the glass wafer facing the micromechanical structures. Apart from covering the micromechanical structures, this allows the glass wafer to be simultaneously used for detecting possible deflections of the micromechanical structures, in that the electrode is, e.g. a component part of a capacitive evaluating arrangement, which detects changes in distance between the glass-wafer electrode and at least one micromechanical structure.

BRIEF DESCRIPTION OF THE DRAWING

The FIGURE shows a sectional view of a device.

DETAILED DESCRIPTION

Figure 1:
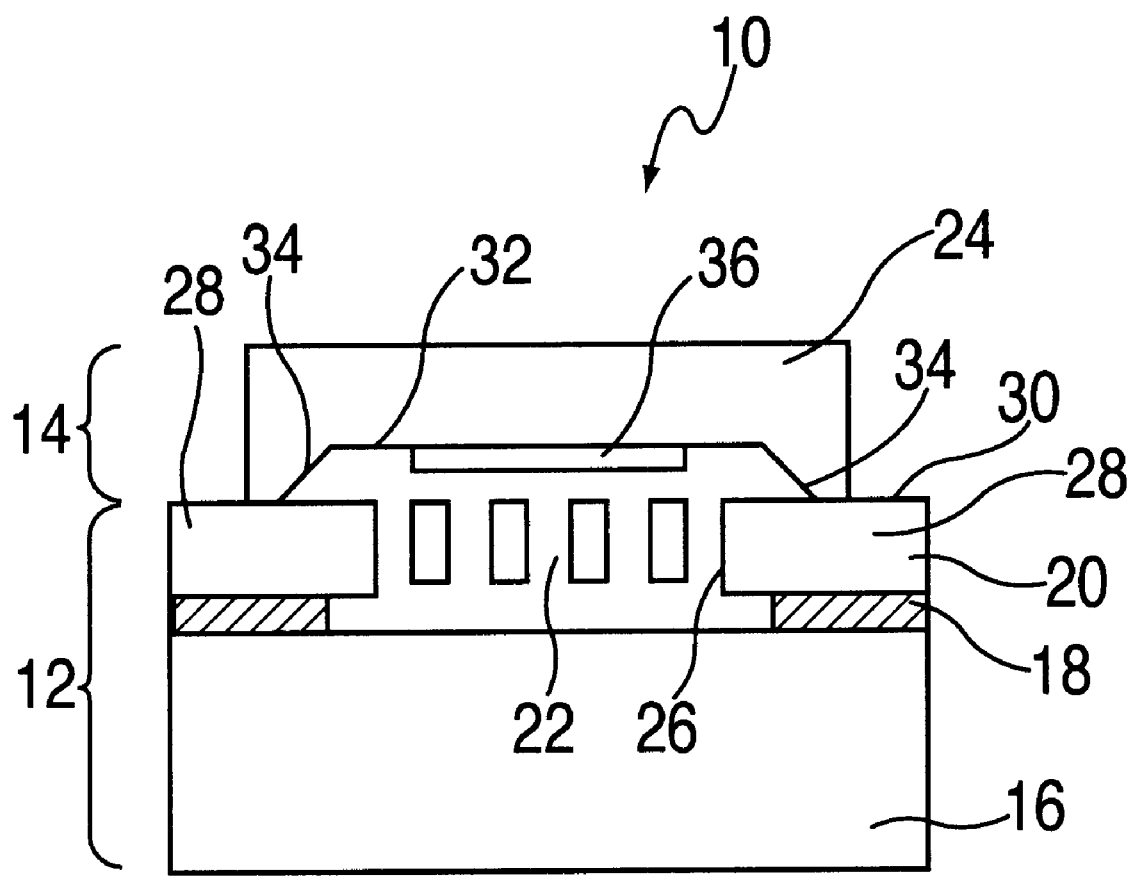

The FIGURE depicts a device indicated as a whole by reference numeral 10, which includes a base wafer 12 and a cap wafer 14 arranged on it. Base wafer 12 includes a silicon substrate 16, a silicon oxide SiO2 layer 18, as well as a polycrystalline silicon layer 20. A micromechanical surface structure 22, which is indicated here in a simplified form and includes, e.g. flexibly suspended seismic masses, is structured in silicon layer 20.

Cap wafer 14 includes a glass wafer 24, which, for example, is made of transparent Pyrex®.

Surface structure 22 is patterned in a recess 26 of silicon layer 20, and is encompassed by a bonding area 28 of silicon layer 20. A top surface 30 of silicon layer 20 is finely planarized, at least in its bonding area 28, and has a maximum roughness <40 nm (P Valley).

In its section facing surface structures 22, glass wafer 24 forms a trough-like depression 32, which is encompassed by a bonding area 34. Bonding area 34 of glass wafer 24 rests on bonding area 28 of silicon layer 20. In this case, bonding areas 28 and 34 are directly bonded to each other without inserting any adhesive agent. The production of this bond will be explained later.

The inner side of recess 32 supports at least one electrode 36, which is integrated into an electronic control and/or evaluation circuit via interconnection lines not shown in further detail.

Glass wafer 24 is transparent. By this means, micromechanical surface structure 22 is visible through glass wafer 24, so that on one hand, surface structures 22 can be optically examined, while on the other hand, surface structures 22 can be integrated into optical devices.

Because of transparent glass wafer 24, surface structures 22 can be specially examined for adhesion effects and mobility, and a general error analysis can be conducted, e.g. examining the bond between glass wafer 24 and silicon layer 20.

For example, device 10 can be a rate-of-rotation sensor or an acceleration sensor. The arrangement of electrode 36, which is preferably positioned so as not to influence or only have a minor influence on an optical examination of micromechanical surface structures 22, allows the electrode to be integrated into a detection of a deflection based on acceleration or rate of rotation of surface structure 22, in that a distance between electrode 26 and surface structure 22 is evaluable through a change in capacitance.

A direct contact area between glass wafer 24 and silicon layer 20 is limited to the minimum width of e.g. 200 µm. Glass wafer 24 can be securely bonded to silicon layer 20 in such extremely small contact areas as a result of planarizing top surface 30 to a roughness <40 nm. Because of the relatively small surface requirement for the actual joining location, micromechanical surface structures 22 can be patterned up to within close proximity of the joint location. Therefore, a high component density can be attained in device 10.

The following is an example of how device 10 can be manufactured:

Initially, base wafer 12 having the sensing device is manufactured in a manner known per se. In this case, silicon oxide layer 18 is deposited on silicon substrate 16, and polycrystalline silicon layer 20 is, in turn, epitaxially grown on the silicon oxide layer at temperatures of, e.g. over 1000° C. After polycrystalline silicon layer 20 is grown, micromechanical surface structures 22 are patterned in relatively thick polysilicon layer 20, under inclusion of intermediate silicon oxide layer 18.

Growing polysilicon layer 20 epitaxially means, that a process is used for growing, which, for example, is known from semiconductor manufacturing for producing monocrystalline silicon layers on a monocrystalline silicon substrate. Such processes are able to yield relatively high layer thicknesses of some 10 µm for polysilicon layer 20. In using this process for attaining a polycrystalline silicon layer 20, a relatively high roughness develops on top surface 30.

Surface structures 20 are patterned using known plasma etching processes, polysilicon layer 20 being partially undercut in order to attain freely suspended surface structures 22, while silicon oxide layer 18 is partially removed.

Silicon oxide layer 18 can be applied, for example, in a CVD Process (chemical vapor deposition), in which case intermediate layer 18 can include, e.g. a plurality of intermediate layers, on whose topmost intermediate layer polycrystalline silicon layer 20 is epitaxially grown.

Top surface 30 of base wafer 12 is subsequently planarized. For example, a CMP method produces an extremely high-grade planarization, resulting in a residual roughness of <40 nm.

Using suitable methods, e.g. etching processes or ultrasonic removal methods, glass wafer 24 is processed in such a manner that recess 32 and bonding areas 34 are formed.

In accordance with further exemplary embodiments, glass wafer 24 can be provided with through holes, if the arrangement of surface structures 22 does not have to be pressure-tight. If necessary, at least one electrode 36 is put into recess 32, e.g. by vapor deposition of electrically conductive materials.

Finally, base wafer 12 is joined to cap wafer 14 by aligning bonding areas 28 and 34 with each other. The joining can be accomplished using anodic bonding, in which wafers 12 and 24 are connected to a voltage source of, e.g. 100 to 1000 V and simultaneously exposed to a temperature of approximately 400° C.

What is claimed is:

1. A device, comprising:
    a silicon substrate;
    a polycrystalline silicon layer arranged on the silicon substrate;
    at least one micromechanical surface structure formed out of the polycrystalline silicon layer and patterned on the silicon substrate;
    a cap wafer formed from a glass wafer and covering the at least one micromechanical surface structure; and
    a planarized bonding area formed out of the polycrystalline silicon layer and provided on a side of the silicon substrate facing the cap wafer, the planarized bonding area encompassing the at least one micromechanical surface structure, wherein:
        the polycrystalline silicon layer is planarized to a high grade at least in the planarized bonding area, and
        the cap wafer is directly bonded to the polycrystalline silicon layer.

2. The device according to claim 1, wherein:
    the glass wafer is optically transparent.

3. The device according to claim 1, wherein:
    the silicon substrate and the polycrystalline silicon layer form a base wafer, and
    the glass wafer includes:
        at least one of through holes and recesses, and
        bonding areas for bonding to the base wafer.

4. The device according to claim 3, wherein:
    the bonding areas have a lateral dimension of ≦200 µm.

5. The device according to claim 3, further comprising:
    at least one electrode arranged on a side of the glass wafer pointing towards the base wafer in a region of a recess.

6. The device according to claim 1, wherein:
    the polycrystalline silicon layer includes a top surface facing the glass wafer.

7. The device according to claim 6, wherein:
    the top surface is planarized to a roughness of <40 nm.

8. The device according to claim 1, further comprising:
    an intermediate layer on which the polycrystalline silicon layer is grown epitaxially.

9. The device according to claim 1, wherein:
    the device is one of a rate-of-rotation sensor and an acceleration sensor.

* * * * *

UNITED STATES PATENT AND TRADEMARK OFFICE
CERTIFICATE OF CORRECTION

PATENT NO. : 6,465,854 B1
DATED : October 15, 2002
INVENTOR(S) : Horst Muenzel et al.

It is certified that error appears in the above-identified patent and that said Letters Patent is hereby corrected as shown below:

<u>Title page, Item [54] and Column 1, line 1,</u>
Change title "MICROMECHANICAL COMPONENT" to
-- MICROMECHANICAL DEVICE --

<u>Column 1,</u>
Line 10, change "devices.  These include" to -- devices include --

Signed and Sealed this

Fourteenth Day of October, 2003

JAMES E. ROGAN
*Director of the United States Patent and Trademark Office*